Figure 1:
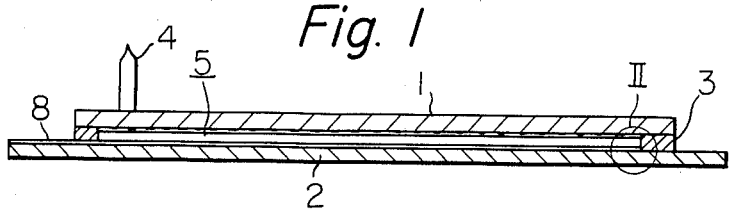

United States Patent [19]
Owaki et al.

[11] 3,944,875
[45] Mar. 16, 1976

[54] GAS DISCHARGE DEVICE HAVING A FUNCTION OF SHIFTING DISCHARGE SPOTS

[75] Inventors: Kenichi Owaki; Toshinori Urade, both of Kobe; Tadatsugu Hirose, Akashi, all of Japan

[73] Assignee: Fujitsu Limited, Japan

[22] Filed: May 17, 1974

[21] Appl. No.: 470,932

Related U.S. Application Data

[63] Continuation of Ser. No. 277,564, Aug. 3, 1972, abandoned.

[30] Foreign Application Priority Data
Aug. 10, 1971 Japan................................ 46-60432

[52] U.S. Cl. ......... 315/169 TV; 313/188; 315/84.5; 340/324 M
[51] Int. Cl.² ........................................... H05B 37/00
[58] Field of Search..... 313/188; 315/84.5, 169 TV, 315/169 R; 340/324 M

[56] References Cited
UNITED STATES PATENTS
| | | | |
|---|---|---|---|
| 3,689,912 | 9/1972 | Dick................................ | 315/169 R |
| 3,701,924 | 10/1972 | Glaser.......................... | 315/169 R X |

*Primary Examiner*—R. V. Rolinec
*Assistant Examiner*—Lawrence J. Dahl
*Attorney, Agent, or Firm*—Maleson, Kimmelman and Ratner

[57] ABSTRACT

Discharge spots on a display device can be shifted by using the primary current effect. For the purpose of shifting the discharge spots, electrodes with a right angle to a shift direction are connected periodically to a plurality of buss to which a series of sustaining signals are supplied in a predetermined time differences. This function of shifting the discharge spots can simplify the peripheral circuit of the display device and also increase a domain of the application of this kind of display device, such as a plasma display panel.

11 Claims, 38 Drawing Figures

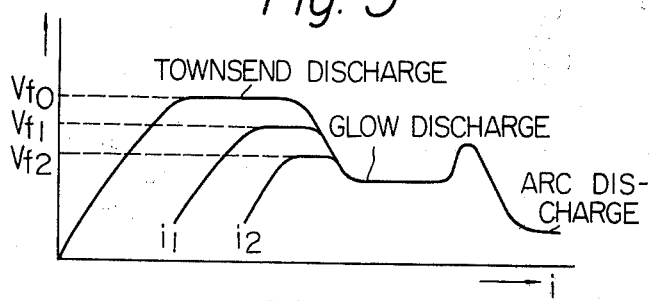
Fig. 5
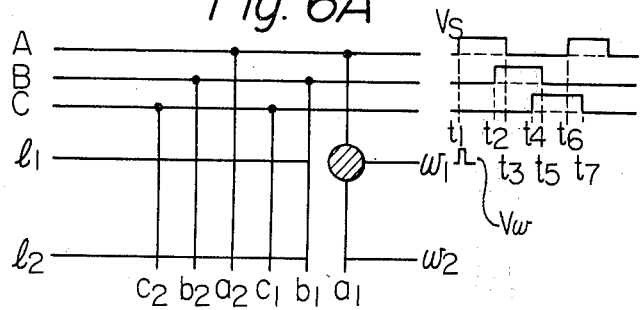
Fig. 6A
Fig. 6B
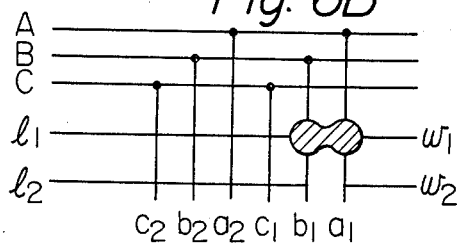
Fig. 6C
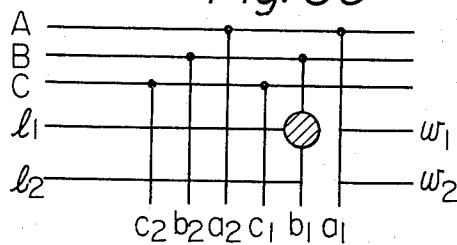

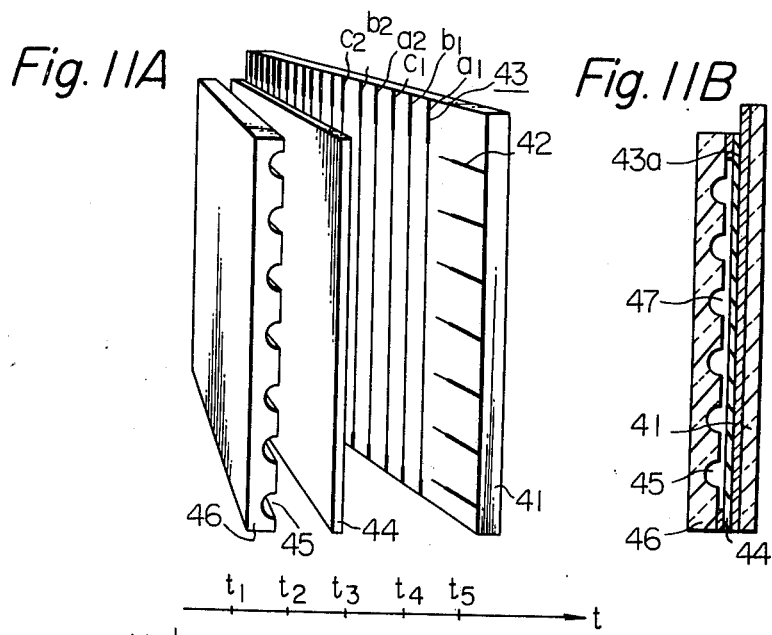
Fig.11A    Fig.11B
Fig.12A  Vw
Fig.12B  VA — a1
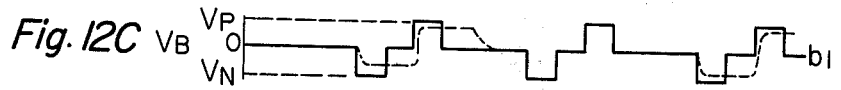
Fig.12C  VB — b1
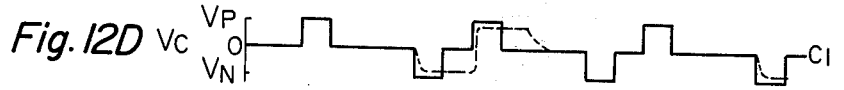
Fig.12D  VC — c1
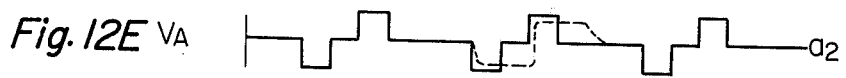
Fig.12E  VA — a2
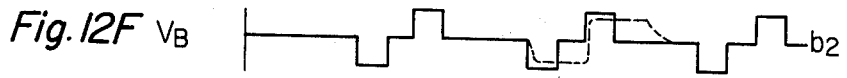
Fig.12F  VB — b2
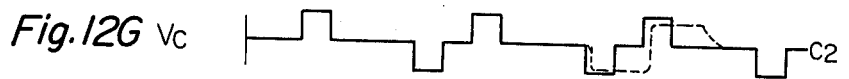
Fig.12G  VC — c2

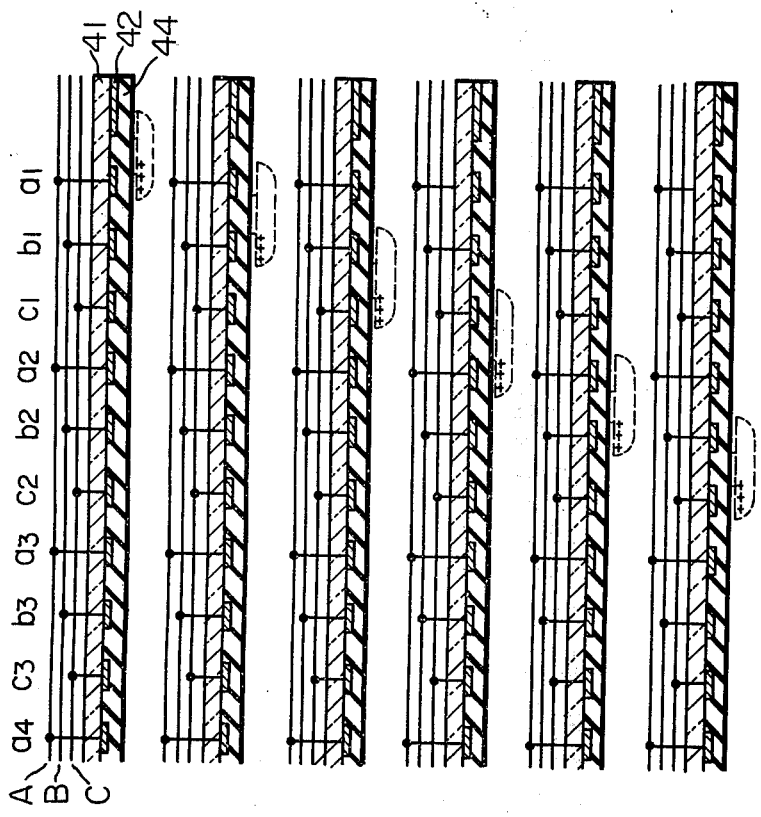

GAS DISCHARGE DEVICE HAVING A FUNCTION OF SHIFTING DISCHARGE SPOTS

This is a continuation of Ser. No. 277,564, filed Aug. 3, 1972, now abandoned.

EXPLANATION OF THE INVENTION

This invention relates to a gas discharge device provided with the function of shifting discharge points. More precisely, to a novel gas discharge device which, for the purpose of record, display or memory of an information signal, can shift an information of discharge spot generated in the elemental discharge area which is a part of a gaseous cell, by using "primary current effect" of said discharge spot.

Conventionally, the dot matrix type display device, called plasma display panel, is known as one of the display devices utilizing gas discharge. The conventional plasma display panel is described in various literature, for example, U.S. Pat. No. 3,499,167, entitled "Gas discharge dislay memory device and method of operating" by Baker et al; and U.S. Pat. No. 3,559,190, entitled "Gaseous display and memory apparatus" by Bitzer et al. Such a plasma display panel is comprised of a gaseous cell filled with gas capable of ionization, and arrays of X and Y electrodes arranged and connected in matrix form so as to provide many "elemental discharge areas" in the gaseous cell. Further the major characteristic feature is to provide a memory function due to wall charges thereon. However, in spite of this characteristic feature the circuit for driving this plasma display panel requires one address circuit for each X and Y electrode. As these address circuits are required to scan in order, the peripheral circuit of this plasma display panel becomes very complex and expensive. In this connection, it cannot be but said that the conventional plasma display panel is somewhat disadvantageous compared with the other devices such as cathode ray tube display devices.

Another display device utilizing gas discharge provides a self scanning device as a means for resolving the abovementioned inconveniences of the peripheral circuit. The trade mark name of the device is "Self Scan". This kind of display device as mentioned, for example, in ELECTRONICS (in U.S.A.) Vol. 43, No. 5, P 120 – P 125, comprises double construction of the scanning part and display part. Discharge spots are moved along each line of the scanning part on the rear face used as an exciting source. The discharge spots are scanned and selectively taken to the display part on the front face, in accordance with the position of said discharge spot, and thereby the display action is carried out.

However, the above-mentioned type of the display device utilizing gas discharge has some natural disadvantages. That is, the construction of a wall, for separating the scanning part and the display part, and the construction of electrodes are complicated and are not suited to mass production. Also the life of each electrode exposed directly to the gaseous cell is short, and an external memory for refreshing is necessary. Further the brightness of the display part decreases as the number of picture elements increases.

An object of the present invention is to provide a plasma display type of a display device utilizing gas discharge which can be driven by an inexpensive peripheral circuit.

Another object of the present invention is to provide a plasma display type of display device utilizing gas discharge which can shift the information discharge spot in an elemental discharge area giving a dot display on the panel from one elemental discharge area to an adjacent elemental discharge area without spoiling its displayed pattern.

A further object of the present invention is to provide a display device utilizing gas discharge which can fix the position of the discharge spot by using the memory function due to the wall charge similar to the above-mentioned plasma display panel.

A still further object of the present invention is to provide a gas discharge device which has the function of shifting the discharge spot which is useful as the device for display, record or memory of the information signal.

For achieving the above-mentioned objects, the display device utilizing gas discharge according to the present invention comprises: a gaseous cell filled with gas capable of ionization; at least one row of electrodes (hereinafter described as Y electrodes), and; a plurality of column electrodes (hereinafter described as X electrodes) positioned in the direction of crossing to above-mentioned Y electrode.

Another embodiment of the present invention, comprises a gap filled with ionizable gas, and a plurality of electrodes arranged in parallel and faced to said gap on the same surface of the substrate. Elemental discharge areas are provided between above-mentioned adjacent electrodes. The advantage of this type of display panel, that is, a surface discharge type display panel, is that the dispersion of the gap length of the two substrates facing each other has no effect on the characteristics of the discharge.

In a further embodiment of the present invention, the display device has a resistance layer formed on the inner surfaces of the gas cell with parallel to the shift direction. The resistance layer serves to assure the shifting operation of the discharge spot.

In the above-mentioned embodiments the elemental discharge areas are arranged sufficiently close together that adjacent elemental discharge areas affect each other in the direction of the shift of the discharge spot by the primary current effect. This arrangement in the present invention is different from the conventional plasma dislay panel in which elemental discharge areas are arranged so as to positively prevent mutual affection.

Herein, the term "elemental discharge area" means the minimum area possible to fire in the gaseous cell. It is positioned between the cross point of X electrodes and Y electrodes, or between adjacent electrodes. The term "the primary current effect" according to the present invention means an exciting action generated by firing into an adjacent elemental discharge area which affects electrons, ions, metastable atoms and photons in the ultra-violet region. It also includes a supply action of primary current from said elemental discharge area to the adjacent elemental discharge area.

An important characteristic feature of the present invention is in the arrangement of the elemental discharge areas in consideration of the above-mentioned primary current effect.

Another characteristic feature is in the construction in which the plurality of electrodes crossed to the direction of the shifting the discharge spot are connected periodically to common buss, and each common bus is connected to sustaining signal sources having a predetermined time differences.

A further characteristic feature of the present invention, is that an input means of the informaton signal is connected only to the first elemental discharge areas in the shift direction, so that the peripheral circuit of the display device can be considerably simplified.

Further features and advantage of the present invention will be apparent from the ensuing description with reference to the accompanying drawings to which, however, the scope of the invention is in no way limited.

Figure 2:
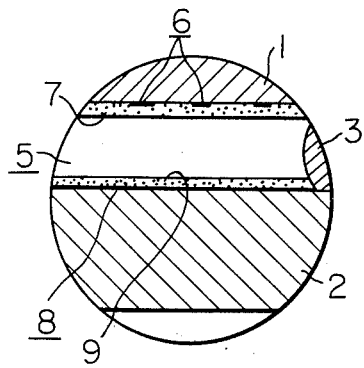
Figure 3:
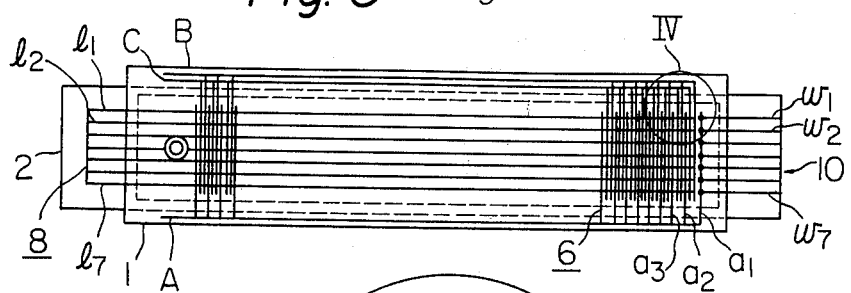
Figure 4:
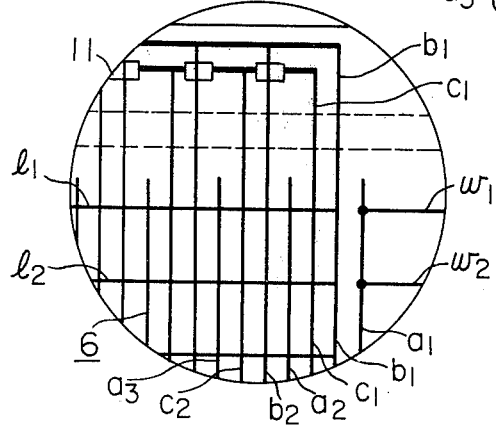
Figure 7:
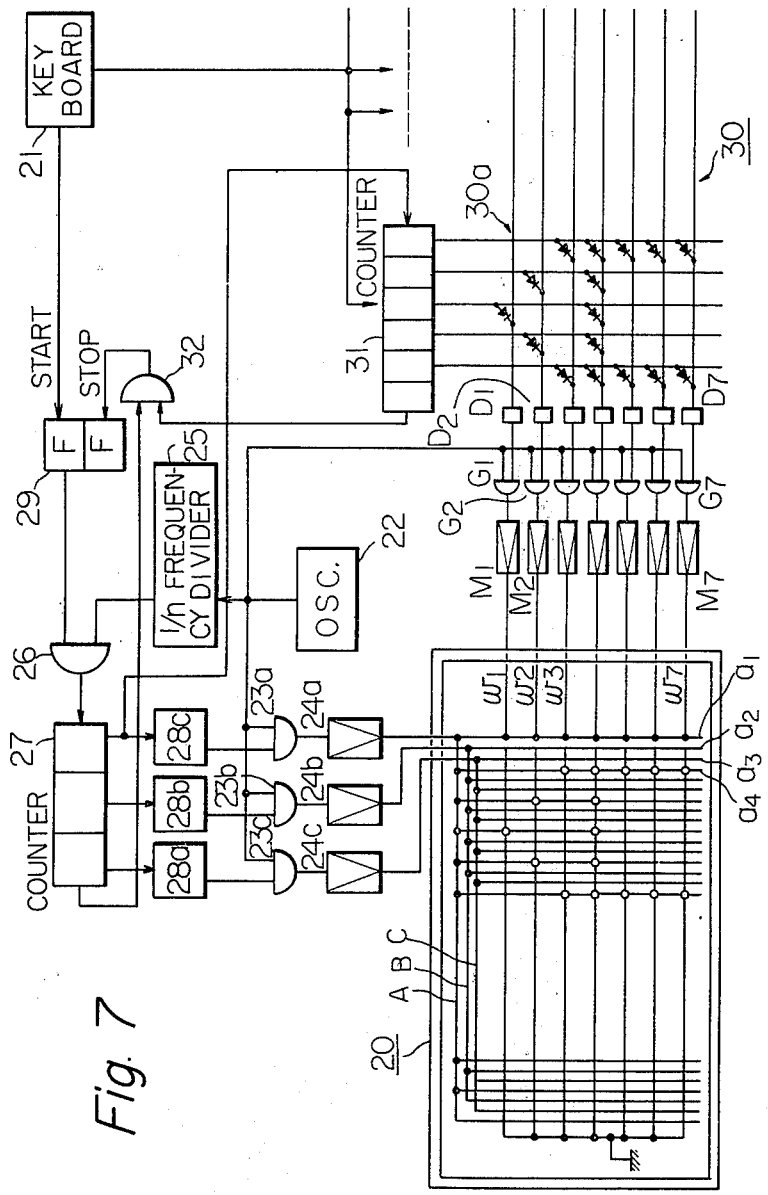
Figure 8:
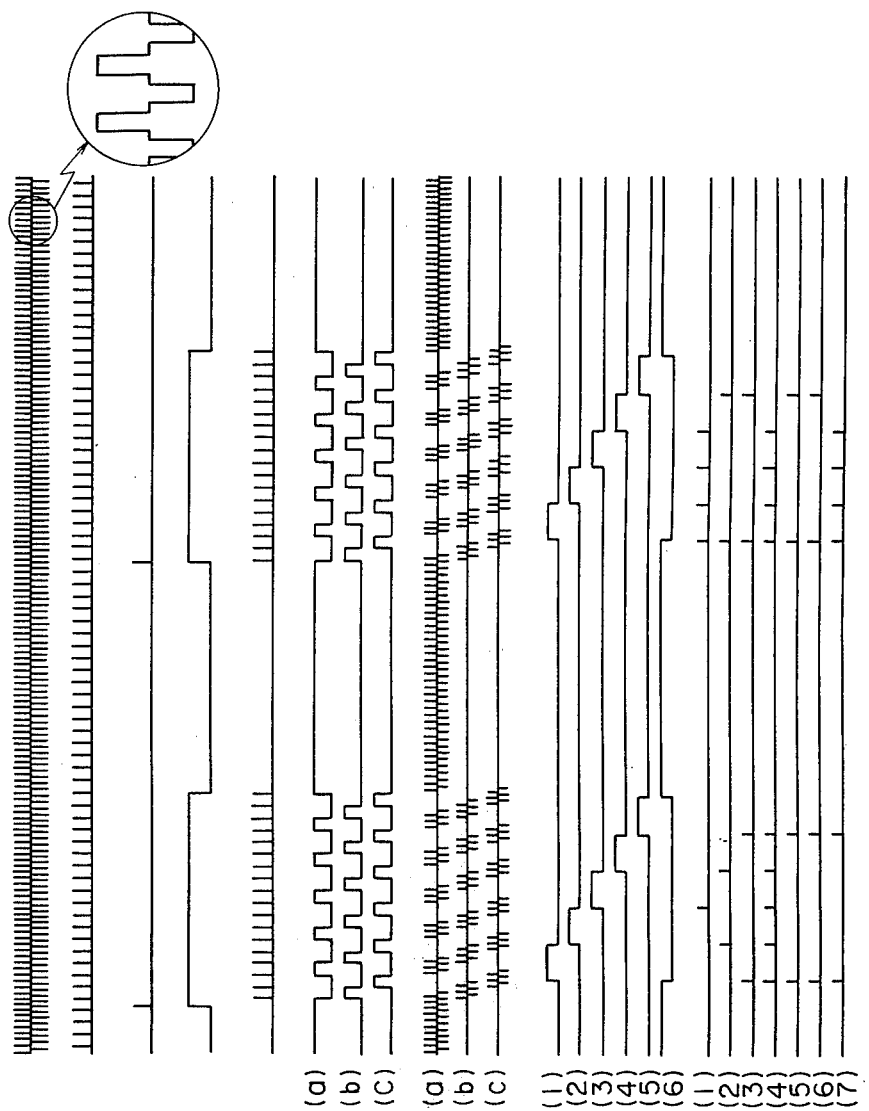
Figure 9:
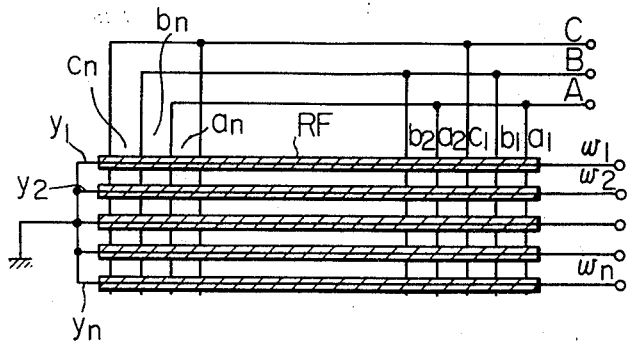
Figure 10:
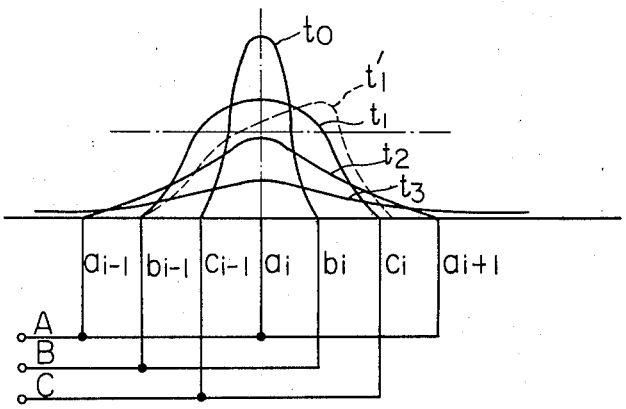
Figure 14:
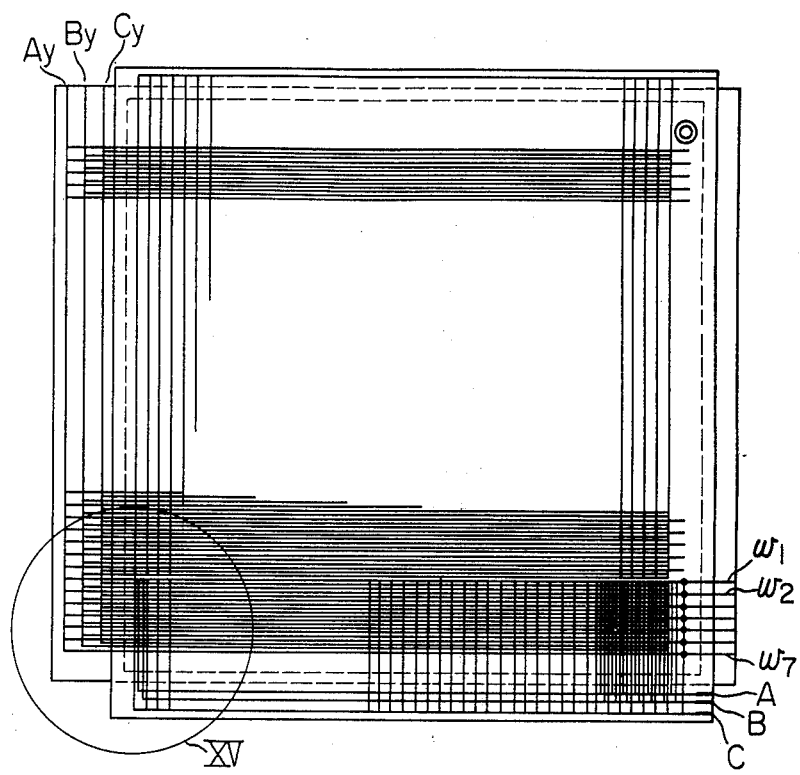
Figure 15:
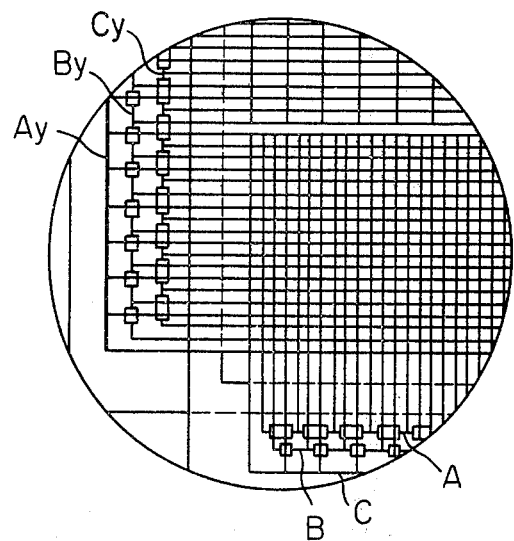
Figure 16:
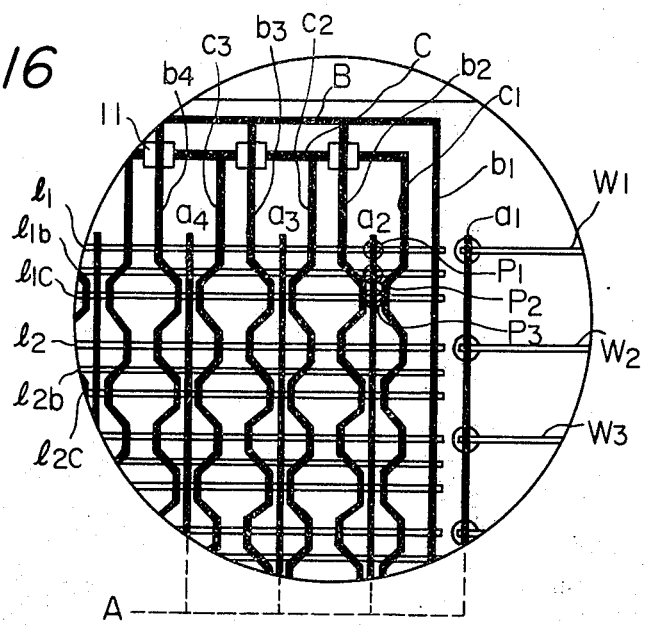

FIG. 1 is a sectional view of the display device utilizing gas discharge of the present invention, FIG. 2 is a partially enlarged view of the device shown at II of FIG. 1, FIG. 3 is a plan view of the display device utilizing gas discharge of the present invention, FIG. 4 is a partially enlarged view of the device shown at IV of FIG. 3, FIG. 5 is a diagram explaining the primary current effect, FIGS. 6A – 6C are diagrams explaining the function of shifting the discharge spot, FIG. 7 is a peripheral circuit of the display device according to the present invention, FIGS. 8A – 8I are the diagrams explaining the function of the peripheral circuit shown in FIG. 7, FIG. 9 is an example of another embodiment of the display device of the present invention, FIG. 10 is a diagram explaining the function of the display device shown in FIG. 9, FIGS. 11A and 11B are examples of further embodiments of the display device of the present invention, FIGS. 12A – 12G are waveforms explaining the function of shifting the discharge spot of the device in FIG. 11, FIGS. 13A – 13F are diagrams explaining the state of shifting the discharge spot of the device in FIG. 11, FIG. 14 is an example of still another embodiment of the present invention, FIG. 15 is a partially enlarged view of the device shown at XV of FIG. 14, FIG. 16 is an example of a still further embodiment of the present invention.

FIG. 1 shows a longitudinal cross section of one embodiment of the device utilizing gas discharge of the present invention. Referring to FIG. 1, a peripheral portion of a pair of glass substrates positioned opposite each other is sealed by low melting temperature glass 3. An ionizable gas (generally a mixed gas of Ne and $N_2$ or Ne and A) is introduced via tip tube 4 into a gap between above-mentioned glass substrates 1 and 2 facing each other. Then a panel type gaseous cell 5 is constructed. An inside surface of the upper glass substrate 1 provides an array of X electrodes 6 composed of fine electrodes arranged parallel each other as shown in FIG. 2. The surface of the array of electrodes 6 is covered by a dielectric layer 7 composed of such as low melting temperature glass. Similarly, an inside surface of the lower glass substrate 2 provides an array of Y electrodes 8, which cross with the above-mentioned X electrodes 6, and is insulated in the same manner from the gas by means of a dielectric layer 9. FIG. 2 shows a partially enlarged sectional view of the portion enclosed by the circle II shown in FIG. 1.

Referring to FIGS. 3 and 4, the plan view of the relation between the array of X electrodes and the array of Y electrodes, which are respectively provided in parallely are clearly indicated. Electrodes belonging to the array of X electrodes are connected every third electrode to common buss A, B and C. These constitute three groups of electrodes, that is, groups $a$, $b$ and $c$. X electrodes $a_1$, $a_2$, $a_3$, . . . $a_n$, which are respectively positioned the first, the fourth, the seventh, . . . , the $(3xn + 1)$th (wherein $n$ is a positive integer, the rest is the same) from the right end of the device, are connected to the bus A. X electrodes $b_1$, $b_2$, $b_3$, . . . , $b_n$, which are respectively positioned the second, the fifth, the eighth, . . . , the $(3xn - 1)$th, are connected to the bus B. X electrodes $c_1$, $c_2$, . . . , $c_n$, which are respectively positioned the third, the sixth the ninth, ..., the $3n$th, are connected to the bus C.

The array of Y electrodes 8 is composed of seven electrodes $l_1$, $l_2$, $l_3$, . . ., $l_7$, commonly connected on the left end of the device. The right ends of these electrodes extend to beneath X electrode $b_1$, which is the second electrode from the right and is connected to the bus B.

For the purpose of providing an input means to this display device utilizing gas discharge, a group of write electrodes 10 is provided facing the first X electrode $a_1$ connected to the bus A. It is noteworthy that this group of electrodes 10 is composed of seven electrodes $w_1$, $w_2$, $w_3$, . . ., $w_7$, which are respectively positioned on the extension line of the above-mentioned Y electrodes $l_1$, $l_2$, $l_3$, . . ., $l_7$. The seven electrodes $w_1$ through $w_7$ are separated between X electrodes $a_1$ and $b_1$ and have independent terminals on the right end of the device.

X electrodes 6, Y electrodes 8, three buss A, B, C and write electrodes 10 are formed by using a technique of a well known screen printing. By using this method of screen printing, a material of electrodes composed by such as gold paste are printed on the glass substrates 1 and 2 in accordance with a predetermined pattern and then baked. When the array of X electrodes 6 are connected to the predetermined common buss, some electrodes cross a bus connected to another electrodes. In this case, it is preferable to use the cross over technique utilizing a dielectric layer 11 as shown in FIG. 4, which shows a partially enlarged portion enclosed by a circle IV shown in FIG. 3.

In the example of the embodiment, the elemental discharge area is constructed in the cross points between the array of X electrodes 6 and the array of Y electrodes 8 including the group of write electrodes 10. In this case, the distance between adjacent elemental discharge areas with respect to a direction of Y electrodes is determined by the pitch of the array of X electrodes 6. The distance between adjacent elemental discharge areas with respect to a direction of X electrodes is determined by the pitch of the array of Y electrodes 8. In the embodiment shown in FIG. 3, the array of X electrodes 6 are arranged with, for example, an equal pitch 200 $\mu$, and the array of Y electrodes 8, for example, three times the pitch of X electrodes, that is, 600 $\mu$.

An experiment according to the present invention is carried out by providing electrodes having a width of 50 –80 $\mu$ in the gaseous cell and a length of gap 200 – 250 $\mu$ filled with a mixed gas of Ne and A, the percentage of which is 0.3%. When the pitch of electrodes is more than 600 $\mu$, the affect to the adjacent elemental discharge areas due to the primary current effect could hardly be recognized. However, when 200 μ is selected as the above-mentioned pitch, the firing voltage of an elemental discharge area adjacent to another fired elemental discharge area becomes lower than its natural firing voltage. Further, in the above-mentioned experiment, the memory function of the discharge due to the wall charge necessary to sustain the pulse discharge was sufficient regardless of the magnitude of the pitch of the electrodes.

The above-mentioned phenomena, that is, the decrease of the firing voltage caused in adjacent elemental discharge areas can be explained by using the primary current effect as follows. The general characteristic of the gas discharge is depicted as a curve in FIG. 5, wherein the ordinate shows the voltage V and the abscissa shows the current $i$. For obtaining a steady glow discharge, the required voltage $V_{fo}$ must initially be sufficient to exceed the Townsend discharge region. However, as the supplied primary current increases from its initial value to $i_1$ and $i_2$ the firing voltage for obtaining a glow discharge decreases from $V_{fo}$ to $V_{f1}$ and $V_{f2}$ as shown in FIG. 5. According to the present invention, the above-mentioned primary current is due to electrons, ions and metastable atoms etc. which are diffused from the fired elemental discharge area and applied to the adjacent elemental discharge area. The firing voltage of the adjacent elemental discharge area then decreases, and then the discharge spot is shifted as hereinafter described.

Further, as clear from the result of the above-mentioned experiment, the affect of such primary current effect is changed considerably in accordance with the magnitude of mutual pitch of the elemental discharge areas. In the above-mentioned example it is understood that the elemental discharge areas in the direction of Y electrodes are arranged with pitches which can be sufficiently subjected to the primary current effect and; the elemental discharge areas in the direction of X electrodes are arranged with pitches which are subjected to no primary current effect.

Next, the function of shifting the discharge spot with regard to the above-mentioned example will be given with reference to FIGS. 6A to 6C. Referring to FIG. 6A when the discharge sustaining voltage $V_s$ is applied to X electrode bus A of group $a$, and the write voltage $V_w$ is applied to the write electrode $w_1$. Then the elemental discharge area crossing of electrodes $a_1$ and $w_1$ comes into a firing state and the primary discharge spot shown by hatching portion in FIG. 6A is generated in this position. This is true where the above-mentioned sustaining voltage $V_s$ and write voltage $V_w$ are selected so as to satisfy the following relation with respect to the firing voltage $V_f$ and wall voltage $V_c$;

$$V_s + V_w > V_f$$

$$V_s + V_c > V_f$$

as similar as the case of conventional plasma display panel. As a result of this, after removing the writing voltage $V_w$, the primary discharge spot in the cross point of electrodes $a_1$ and $w_1$ is memorized in a form of wall charge and held by the sustaining voltage $V_s$.

When, in the above-mentioned condition, the sustaining voltage is applied in time $t_2$ to X electrode bus B of group $b$, the elemental discharge area in the cross point of electrodes $b_1$ and $l_1$ is fired by the primary current effect, or the above-mentioned primary discharge spot enlarges to this elemental discharge area. FIG. 6B shows the state of the discharge spot in this condition. And when the sustaining voltage $V_s$ applied to electrode bus A is suspended in time $t_3$, the above-mentioned primary spot is completely displaced to the elemental discharge area in the cross point of electrodes $b_1$ and $l_1$, as shown in FIG. 6C, and the first shift action is completed. Next, when the sustaining voltage is applied to bus C of group $c$ of X electrodes, and the sustaining voltage for the bus B is suspended in time $t_5$, the discharge spot in the cross point of electrodes $b_1$ and $l_1$ is transferred to the adjacent elemental discharge area in the cross point of electrodes $c_1$ and $l_1$, and the second shift action is completed. Further, when the sustaining voltage $V_s$ is again applied to the bus A in time $t_6$ and the sustaining voltage for the bus C is suspended in time 7, the discharge spot is transferred to the cross point of electrodes $a_1$ and $l_1$, and one cycle of the shift action has been completed.

In this manner the primary discharge spot caused by the write voltage $V_w$ can be shifted along Y electrodes to the left end of the device. And this action is similarly carried out in other elemental discharge areas in the direction of the Y electrodes related to the write electrodes $w_2, w_3, \ldots, w_7$. During this action, discharge spots do not jump to the adjacent Y electrodes, because, as mentioned already, the elemental discharge areas in the direction of X electrodes are arranged with pitches at sufficient distances so that no primary current effect appears.

When the above-mentioned shift action is carried out, the information of the discharge spot of original elemental discharge area should be completely erased till the sustaining voltage of next cycle is applied. That is, if the wall charges caused by the discharge remain in the original elemental discharge area, and the sustaining voltage in next cycle is applied, the firing of the original elemental discharge area is caused thereby and the discharge spot is inappropriately shifted. According to the present invention, the distance between the adjacent elemental discharge areas is very small. Therefore, the wall charges of the original elemental discharge area are neutralized by the discharge in the next elemental discharge area. Accordingly, when the period of the cycle of the sustaining voltage is selected in the order of the time required for the wall charges to disappear by the neutralizing action, the information in the original elemental discharge area can be erased in a comparably short time. Further, when more rapid action is required, an erase pulse can be applied following the sustaining voltage for the each group of X electrodes.

When it is required to fix the discharge spot to a particular elemental discharge area, the above-mentioned shift action is first carried out to the desired elemental discharge area. Then the change of the sustaining voltage $V_s$ is suspended and the sustaining voltage is applied only to the desired group of X electrodes. In this state, the pulse discharge in the above-mentioned elemental discharge area is repeated with the sustaining voltage and the wall voltage in the same manner as in the plasma display panel. This condition will be hereinafter called "fixed state".

Above-mentioned display device utilizing gas discharge can be used not only as an information display device, but also as a memory device or a recording device. FIG. 7 shows one example of a block diagram of a driving circuit of the display device used as a display panel constructed by dot matrix wherein one character is composed of 35 bits. The display panel is shown with reference number 20.

A driving circuit for this display panel comprises, as essential parts, a keyboard 21 and a high frequency generator 22, which generates pulse voltage having a frequency of 50 – 100 kHz. This high frequency generator 22 is connected respectively via amplifiers 24a, 24b and 24c, and gate circuits 23a, 23b and 23c to buss A, B and C. These three buss are respectively connected to the three groups of X electrodes. In addition the high frequency generator 22 is connected respectively via gate circuit $G_1$, $G_2$, . . ., $G_7$ and amplifier $M_1$, $M_2$, . . ., $M_7$ to seven write electrodes $w_1$, $w_2$, $w_3$, . . ., $w_7$. And another output of the high frequency generator 22 is connected via $1/n$ frequency divider 25 and one input of gate circuit 26 to the three stage counter 27. The output of the three stage counter 27 is connected, via hold circuits 28a, 28b and 28c, to other inputs of the above-mentioned gate circuits 23a, 23b, and 23c.

Assuming that the high frequency generator 22 generates a series of pulses shown in FIG. 8A, and the output of the frequency divider 25 is shown in FIG. 8B. In this condition, when a desired character on the key board is keyed, a start signal shown in FIG. 8C is generated therein, and a flip-flop circuit 29 is set by this start signal. The output of the flip-flop circuit 29, as shown in FIG. 8D, is supplied to other terminal of gate circuit 26. As a result of this, the gate circuit 26 opens, and the output of the frequency divider 25, shown in FIG. 8B, is supplied to the three stage ring counter 27, as shown in FIG. 8E. When the reset state of the ring counter 27 is settled to (1, 0, 0), the counted output of each stage appears respectively as shown in form of a, b and c in FIG. 8F. The counted outputs shown in FIG. 8F are applied respectively to the hold circuits 28a, 28b and 28c which shape these output waveforms so that the fall time of one output slightly overlaps the rise time of the counted output of next stage. The gate circuits 23a, 23b and 23c are then opened in order. Thus, the sustaining voltage is applied from the high frequency generator to buss A, B and C connected respectively to three groups of X electrodes with a timing relation as shown in FIG. 8G.

Further, the horizontal lines of a group of diode matrix 30, for generating a character pattern, are connected respectively via differentiation circuits $D_1$, $D_2$, . . ., $D_7$ and the gate circuits $G_1$, $G_2$, . . ., $G_7$ to write electrodes $w_1$, $w_2$, . . ., $w_7$ of the display panel 20. Each vertical line of the group of the diode matrix 30, which corresponds to one character, is connected, in order, to each stage of the six stage ring counter 31. They are then scanned by the output of the first stage of the three stage ring counter 27 that is, the output connected to bus A of the display panel 20.

Thus, when the key board is operated, at the same time the start signal, shown in FIG. 8C, is generated, the address information of a selected a character is decoded and the corresponding six stage ring counter 31 is selected. As a result of this, the ring counter 31 counts the output of the first stage of the three stage ring counter 27, that is the pulse shown (a) of FIG. 8F, and scans, for example, the diode matrix 30a corresponding to the character "A". The outputs of the diode matrix 30a are differentiated by the differentiation circuit $D_1$, $D_2$, . . ., $D_7$. Said differentiated outputs control the gate circuit $G_1$, $G_2$, . . ., $G_7$, and the informations corresponding to each vertical line is supplied, in regular order, from the high frequency generator 22 to the write electrodes $w_1$, $w_2$, . . ., $w_7$ of the display panel 20. FIG. 8H shows the contents of each stage of the six stage ring counter 31. FIG. 8I shows the write voltages for each write electrode.

When the pattern information of the first column of the diode matrix is supplied to the write electrodes $w_1$, $w_2$, $w_3$, . . ., $w_7$, the sustaining voltage is supplied to the bus A of group a of X electrodes including the first electrode $a_1$. Then the elemental discharge areas belonging to the first column discharge, in accordance with the above-mentioned pattern, and the discharge spots are produced. And when the supply of the sustaining voltage changes from bus A to bus B by the output of the three stage ring counter 27, these discharge spots shift to the elemental discharge areas arranged on the second electrode $b_1$ of X electrodes. Similarly, in accordance with the exchange of the sustaining voltage from bus B to bus C, these discharge spots shift to the elemental discharge areas arranged on the third electrode $c_1$ of X electrodes. When the counter 27 is reset and the sustaining voltage is supplied again to the terminal A, the original discharge spots are shifted to the elemental discharge areas arranged on the fourth electrode $a_2$ of X electrodes. At the same time, a pattern information belonging to the second column of the diode matrix 30a is written to the elemental discharge areas arranged on the first electrode $a_1$. When such shift actions and write actions are repeated five times, the writing corresponding to one character is completed, and then the character "A" is displayed on the panel 20. In this condition, when the reset signal of the six stage ring counter 31, and the reset signal of the three stage ring counter 27, are applied as a stop signal via an AND circuit 32 to a reset terminal of the flip-flop circuit 29, the exchange of the sustaining signal ceases, as clear from FIGS. 8F and 8G. At this time the discharge spots are fixed on the displayed position, that is, on the elemental discharge areas arranged on group a of X electrodes. This fixed condition can be held until a next key-in operation.

Thus the information keyed on the key board 21 is displayed on the panel 20 in order. If false information is input by reason of mistaken keying, a wrong character can be corrected by using a function of shift back. This shift back function can be carried out by changing the exchange order of the sustaining voltage from A → B → C → A to A → C → B → A. Actually, the connection of the outputs of each stage of three stage ring counter 27 is changed on the key board 21.

FIG. 9 shows another embodiment of the display device utilizing gas discharge according to the present invention. Referring to FIG. 9, resistance films RF are provided on the dielectric layer in the shift direction along every Y electrode, $y_1$, $y_2$, . . ., $y_n$. The object of the resistance films is; to disperse the wall charges along these films; to increase a coupling to adjacent cell in the shift direction, and; to carry out surely the self shift action. In the example shown in FIG. 9, the discharge spots are shifted in the direction of electrodes $y_1 - y_n$. The strip of the resistance films RF are then provided on the dielectric layer on these electrodes $y_1 - y_n$. These resistance films can be provided on another dielectric layer faced to the above-mentioned dielectric layer or on both of these dielectric layers. These resistance films can be formed by coating, evaporation coating or chemical treatment, and when the dielectric layer is composed of PbO, it can be formed by a reducing treatment. These resistance films are preferably transparent. However, when the width of these films is very narrow such as the order of 100 μ, the effect of these films on the display can be neglected. Also it is required that these films be resistant to ion bombardment and have a good adhesion to the dielectric layer.

Assuming that the discharge spot is generated on the electrode $a_1$ and the wall charge along each electrode, at the discharge when finishing is shown with curve $t_o$ in FIG. 10. This curve changes with the passage of time to curve $t_1 - t_3$. Then, when a voltage, with a potential difference to the wall voltage larger than the firing voltage, is supplied to the electrode $b_i$, the discharge spot is shifted to the electrode $b_1$ as shown in curve $t_1'$. That is, after suspending the supplied voltage to the electrode $a_1$, the above-mentioned voltage is supplied to the electrode $b_i$.

As mentioned above, in the embodiment shown in FIG. 9, the effect of the wall voltage shown in FIG. 10 is superimposed on the primary current effect, and thereby, the discharge spot can be shifted more surely.

FIGS. 11A and 11B are a further embodiment of the display device of the present invention. Referring to FIGS. 11A and 11B, a plurality of shift electrodes 43 are formed in parallel on the same substrate 41. Write electrodes 42 are provided at right angles and close to the most outside electrode of the array of shift electrodes 43. These electrodes 42 and 43 can be formed with evaporation coating or printing technique. A dielectric layer 44 is provided on these electrodes 42 and 43. A gap 47 with ionizable gas is formed between the dielectric layer 44 and cover 46 the peripheral portions of which are sealed. The cover 46 provides grooves 45 corresponding with the write electrodes 42 and at right angles with the shifting electrodes 43. The array of shift electrodes are periodically connected to the buss for supplying the sustaining voltage in the same manner as shown in FIGS. 3, 7 and 9.

When the write voltage is supplied to selected write electrode 42, at the time that the sustaining voltage is supplied to electrode $a_1$, the discharge is produced in the groove 45. The charged particles caused by the discharge can be moved only in the direction of the groove 45. Then, the discharge spot between the electrodes 42 and $a_1$ can be shifted from the electrodes $a_1$ to $b_1$ in the moment when the sustaining voltage is supplied to the electrode $b_1$.

FIG. 12 is a diagram explaining a function of the display device of FIGS. 11A and 11B. Referring to FIG. 12, each voltage is selected so as to satisfy the following equation:

$$V_P + V_W > V_F \tag{1}$$

$$V_F > V_P - V_N > V_{LP} \tag{2}$$

$$V_P - V_N - V_{LN} > V_F \tag{3}$$

wherein:
$V_W$ = write voltage applied to the write electrode 42;
$V_A$ = voltage applied to the electrodes $a_1, a_2, \ldots, a_n$;
$V_B$ = voltage applied to the electrodes $b_1, b_2, \ldots, b_n$;
$V_C$ = voltage applied to the electrodes $c_1, c_2, \ldots, c_n$;
$V_F$ = firing voltage;
$V_{LP}$ = positive polarity voltage of the wall voltage;
$V_{LN}$ = negative polarity voltage of the wall voltage;
$V_P$ = positive polarity voltage of $V_A, V_B, V_C$;
$V_N$ = negative polarity voltage of $V_A, V_B, V_C$.

In time $t_1$, as shown in FIG. 13A, the relation shown in equation (1), above, is established between the write electrode 42 and the electrode $a_1$, and the discharge spot is produced therein. In time $t_2$, by the primary current effect, the above-mentioned discharge spot is shifted by the voltage applied between electrodes $a_1$ and $b_1$. This state is shown in FIG. 13B. Next, in time $t_3$, the discharge spot between electrodes $a_1$ and $b_1$ is shifted to between electrodes $b_1$ and $c_1$ by the voltage applied between these electrodes. Each shifting state of the discharge spot in time $t_3$, $t_4$, $t_5$ and $t_6$ are respectively shown in FIGS. 13C, 13D, 13E and 13F. As mentioned above, in the dislay device utilizing the plane discharge as shown in FIGS. 11A and 11B, the discharge spot is shifted in the predetermined direction on the device providing an array of shift electrodes 43 and a gap with grooves filled with ionizable gas. Further in this example of the embodiment, it is not necessary to be careful of the accuracy of a gap filled with ionizable gas because the discharge spot is produced between the adjacent electrodes arranged in parallel on the same substrate. In addition, it is very effective to provide strips of resistance film as shown in FIG. 9, in the direction of the shifting discharge spots.

As is clear from the above-mentioned explanation, the function of shifting the discharge spot according to the present invention contributes to the simplification of its peripheral circuit. That is, whereas previously one driving circuit for each X electrode was required, the present invention requires only three circuits for the X electrodes without spoiling the original function of plasma display panel.

This advantage of the simplification of the peripheral circuit appears even more remarkable in the large scale display device having a function of shifting the discharge spot not only in the direction of Y electrodes but also X electrodes. For realizing a device having a function of shifting the discharge spot in both direction, it is necessary to also close the distances between the adjacent elemental discharge areas in the direction of X electrodes, so as to affect the primary current effect. In addition, the Y electrodes are also connected periodically to the common buss $A_y$, $B_y$ and $C_y$ as shown in FIG. 14, a partially enlarged portion of which is shown in FIG. 15. Referring to FIG. 15, the pitches of the group of the Y electrodes are selected sufficiently close so as to make the distances between the adjacent elemental discharge areas in the direction of X electrodes affect the primary current effect. And these Y electrodes are connected periodically to three buss $A_y$, $B_y$ and $C_y$ similar to the case of the X electrodes. In the above-mentioned display panel, the information corresponding to one column is applied to seven write electrodes $w_1, w_2, \ldots, w_7$. The buss $A_y$, $B_y$ and $C_y$ are then energized in order, and the above-mentioned information is shifted upwardly in the direction of the X electrodes. All of the discharge spots are fixed to the position shifted completely from the position corresponding to the write electrodes. The information corresponding to the next column is supplied to the write electrode $w_1, w_2, \ldots, w_7$.

It is easily accomplished, by any person having common knowledge in the technical field to which this invention belongs, that the arrangement shown in FIGS. 14 and 15 is applied to the devices shown in FIG. 9 and FIGS. 11A and 11B.

According to a further embodiment of the present invention, the display device is capable of superposing the displayed patterns, or changing its order, by fixing the written information in a suitable position and shifting the next information which is written. FIG. 16 shows a partially enlarged portion of the device having the special feature of electrodes of this embodiment. The same reference numerals are used for the same portions as in FIG. 1. Referring to FIG. 16, the first sub-Y electrodes $l_{1b}$, $l_{1c}$, . . ., and the second sub-Y electrodes $l_{2b}$, $l_{2c}$, . . ., are added to main-Y electrodes $l_1$, $l_2$, . . ., etc. And as shown in FIG. 16, electrodes $c_1$, $c_2$, . . ., and $b_2$, $b_3$, . . ., which are connected to the buss B and C are closed to electrodes $a_2$, $a_3$, . . . connected to the bus A in the position of crossing to sub-electrodes $l_{1c}$, $l_{2c}$, . . ., etc. With regard to the main-Y electrodes, the X electrodes of this device are arranged with equal pitches. With regard to the second sub-Y electrodes, the X electrodes are arranged with pitches periodically closed as shown in FIG. 16.

In the device shown in FIG. 16, the discharge spot generated by the information applied to the write electrodes $w_1$, $w_2$, . . ., $w_7$ can be shifted along the main-Y electrodes $l_1$, $l_2$, . . ., etc. Further it can be fixed on an X electrodes connected to bus A by supplying a sustaining voltage continuously only to the bus A. This spot is shown by $P_1$. In this condition, when the first sub-Y electrodes $l_{1b}$, $l_{2b}$, . . . are energized and the main-Y electrodes are de-energized, the above-mentioned spot $P_1$ is shifted to a position $P_2$ by the primary current effect. Next, when the first sub-Y electrodes $l_{1b}$, $l_{2b}$, . . ., are de-energized, and the second sub-Y electrodes $l_{1c}$, $l_{2c}$, . . ., are energized, the spot $P_2$ is shifted to a position $P_3$ by the primary current effect and stored in the position $P_3$.

In the stored positions along the second sub-Y electrodes, the primary current effect is not affected in the shift direction, because the distances of the adjacent X electrodes are periodically separated more than the regular distance. And the distance between the main-Y electrodes $l_1$, $l_2$, . . ., and the second sub-Y electrodes $l_{1c}$, $l_{2c}$, . . ., are separated sufficiently so that the primary current effect is not effected between them. As a result of this, the discharge spot stored in the position $P_3$ is maintained, even when the main-Y electrodes are energized and the sustaining voltages are supplied to the buss A, B and C in the shift mode. That is, the next information can be shifted while the first information is stored. When it is required to superimpose different patterns or change the order of different patterns, it is sufficient to return the stored discharge spot to a shift position on the main-Y electrodes. For the purpose of returning the discharge spot from the stored position to the shift position, it is sufficient to energize the first sub-Y electrodes $l_{1b}$, $l_{2b}$ , . . ., and then de-energize the first and second sub-Y electrodes.

According to the present invention, the characteristic feature of the function of shifting the discharge spot is carried out in its original form of information which is written. The advantage of this function is that the information written can be read or recorded later.

That is, when photo-electric converting elements are connected to the last column of the elemental discharge areas, the information sent by the form of discharge spots can be read in order. Thus, it is very advantageous that the present device may be utilized as a memory device by using the memory function due to the wall charge. And, when the terminals of the optical fibers are connected to the last column of the arrangement of the elemental discharge areas, and other terminals of the optical fibers are faced to a photo sensitive paper synchronized in movement with the shift action of the discharge spot, the displayed pattern can be easily recorded. In this case, the function can be carried out even when one Y electrode, that is, only one row of the arrangement of the elemental discharge area, is utilized.

In the above-mentioned embodiment and application, the explanation was given in the case that the input means for the information signal was given to the write electrode faced to the first column of the arrangement of the elemental discharge areas. However, it is understood that this input means can be replaced by optical input means, or input means using voltage probe. These are well known for this kind of device utilizing gas discharge. Also the position for connecting the information signal is not limited to the first column of the arrangement of the elemental discharge areas. It is understood that it is one of the characteristic features that the present invention can be applied to a conventional plasma display panel connecting individual address drivers to both the arrays of X and Y electrodes. The information written therein being shifted by a random address method.

Also, in the above-mentioned embodiment, the Y electrodes are separated from the write electrodes. However, the same function can be carried out by connecting these electrodes to each other and controlling a phase of the voltage applied to the first X electrodes in accordance with the time of write.

Further, the number of the groups of the X electrodes are not limited to three. The same function can be carried out by connecting these X electrodes to a plurality of buss, with predetermined periods, and applying the sustaining voltage modulated by the pulse of poly phase.

Above all, the essential part of this invention is based on the idea of shifting the information of the first discharge spot generated in the elemental discharge areas connected to the input means to adjacent elemental display areas by using the primary current effect. The gas discharge display apparatus as herein described was announced at the International Symposium of Information Display in 1972 (1972, SID, Digest of Technical Papers, pgs. 38–39). It is understood that various modifications except for above-mentioned embodiment are possible.

What is claimed is:

1. A driving means for a display device utilizing gas discharge which includes a gap filled with ionizable gas, a plurality of electrodes arranged so as to provide elemental discharge areas in said gap, means for connecting said electrodes arranged at right angles to a shift direction of a discharge spot generated in said elemental discharge area to a plurality of buses periodically comprising:

a high frequency generator which generates a series of high frequency signals;

a group of first gate circuits, a first of the inputs of said first gate circuits being connected to the output of said high frequency generator and the outputs of said first gate circuits being connected respectively to said buses periodically;

a group of second gate circuits, a first of the inputs of said second gate circuits being connected to the output of said high frequency generator and outputs of said second gate circuits being connected respectively to different write electrodes;

a frequency divider which is connected to said high frequency generator;

a third gate circuit, one input of which is connected to said frequency divider, means for applying a start signal to another input of said third gate circuit;

a first ring counter the input of which is connected to said third gate circuit and the outputs of which are connected to a second of the inputs of said first gate circuits, a second ring counter which is scanned by a first stage output of said first ring counter, a diode matrix corresponding to one character, the vertical lines of which are respectively connected to the output of said second ring counter and the horizontal lines of which are respectively connected to a second of the inputs of said second gate circuits, and;

an AND circuit, two inputs of which receive respectively reset signals from said first and second ring counters and supply a stop signal to said third gate circuit.

2. Gas discharge display apparatus comprising:
a. a pair of base plates having a gap therebetween, said gap being filled with an ionizable gas;
b. a first group of electrodes arranged on an inner side of one of said base plates;
c. a second group of electrodes arranged on an inner side of another of said base plates directionally positioned to cross said first group of said electrodes so as to provide elemental discharge areas in said gap;
d. a dielectric layer covering at least one of said first and second group of electrodes so as to insulate said group of electrodes from said ionizable gas;
e. means for connecting electrodes belonging to said first group of electrodes periodically to a plurality of buses;
f. means for supplying operation voltages sequentially to said elemental discharge areas arranged along said first group of electrodes via said buses connected to the first group of electrodes and to said second group of electrodes, said supplied operation voltages being lower than the firing voltage of said elemental discharge areas, said supplied operation voltages being sufficient for initiating a discharge in said elemental discharge areas adjacent to a direction of said second group of said electrodes upon any elemental discharge area in a discharging state, said operation voltages being selected so as to be summed with a wall voltage resulting from wall charges produced on the surface of said dielectric layer in a gas discharged state in a manner to exceed said firing voltage;
g. control means connected to said operation voltages supplying means for controlling the exchange of said operation voltage so as to continuously supply said operation voltage via at least one of said buses, and;
h. means for inputting an information signal to at least one of said second group of electrodes so as to discharge the elemental discharge areas corresponding to said one of said second group of electrodes;
thereby
 1. shifting the discharged spot produced in accordance with said information signal in said elemental discharge area which is coupled to said input means, in the direction of said second group of electrodes by exchanging said operation voltage applied via said bus, and;
 2. obtaining a display in said elemental discharge area arranged on the electrode connected to said bus to which said operation voltage is continuously supplied when said exchange of said operation voltage is ceased by said control means.

3. Gas discharge display apparatus according to claim 2, wherein said input means for an information signal includes a plurality of write electrodes which are provided facing one outside electrode of said first group of electrodes and corresponding to each electrode of said second group of electrodes.

4. Gas discharge display apparatus according to claim 2, including reading means for discharge spots on said elemental discharge areas arranged on the last shift position along said second group of electrodes.

5. Gas discharge display apparatus according to claim 2 including:
a. means for periodically connecting electrodes belonging to second group of electrodes to said plurality of said busses;
b. a second electric source having a second exchange means for supplying an operation voltage to said elemental discharge areas along said second group of electrodes periodically via said plurality of said buses, and;
c. a second control means which is connected to said second electric source so as to cease exchanging of said operation voltage and supply said operation voltage to at least one bus;
thereby:
 1. exchanging in order said operation voltage to said second group of electrodes in the state that the exchanging of the operation voltage to said first group of electrodes is ceased, and;
 2. shifting a discharge spot which is generated in accordance with said information signal to said adjacent elemental discharge area in the direction of electrodes of said first group of electrodes.

6. Gas discharge display apparatus according to claim 2, wherein a first and a second sub-electrode are provided in parallel between electrodes belonging to said second group of electrodes, each electrode of said first group of electrodes which is connected periodically to the three buses is crossed to electrodes of said second group of electrodes with equal distance and is crossed to said second sub-electrodes with unequal distances, said first and second sub-electrodes are connected to other operation voltage sources via common terminals respectively.

7. Gas discharge display apparatus according to claim 2, wherein a resistance layer along said second group of electrodes is provided on said dielectric layer.

8. Gas discharge display apparatus comprising:
a. a pair of base plates having a plurality of grooves therebetween and filled with ionizable gas;
b. a plurality of electrodes provided on one of said base plates and arranged in parallel so as to cross said grooves and arranged in elemental discharge areas between adjacent electrodes;
c. a dielectric layer covering said electrodes so as to insulate said electrodes from said ionizable gas in said grooves;
d. means for connecting each of said electrodes periodically to a plurality of buses;

e. means for supplying an operation voltage periodically via said bus to adjacent electrodes, which operation voltage is lower than the firing voltage between adjacent electrodes though sufficient for initiating a discharge in said grooves between adjacent electrodes which is adjacent to a discharge spot in the same groove and is selected so that a sum with a wall voltage due to wall charges produced on the surface of said dielectric layer in a gas discharge state exceeds said firing voltage;

f. control means connected to said operation voltages supplying means so as to cease an exchange of said operation voltage and to continuously supply said function voltage only between two adjacent electrodes; and g. write electrodes for an information signal facing the most outside electrode at one end of said grooves;

thereby 1. shifting a discharge spot which is generated in accordance with said information signal applied to said write electrodes as a discharge spot between adjacent electrodes in each groove by exchanging an operation voltage, and;
2. obtaining a display between two adjacent electrodes of said each groove of said electrodes by said operation voltage which is continuously supplied between said adjacent electrodes, when said exchange of said operation voltage is ceased by said control means.

9. A method for shifting discharge spots which are displayed on a plasma display/memory panel, said panel comprising a pair of base plates having a gap therebetween, said gap being filled with an ionizable gas; a first set of electrodes arranged on an inner side of one of said base plates, a second set of electrodes arranged on an inner side of another of said base plates directionally positioned to cross said first set of electrodes so as to provide elemental discharge areas in said gap; a dielectric layer covering at least one of said first and second sets of electrodes so as to insulate said first set of electrodes from said ionizable gas; characterized in that: said method comprises a. generating discharge spots with a pattern in accordance with an input signal in a group of said elemental discharge areas which are arranged in a first group of electrodes,
b. supplying a sustaining voltage at least to said elemental discharge areas which are arranged in said first group of electrodes to sustain said discharge spots having a pattern in accordance with an input signal,
c. supplying to elemental discharge areas associated with a second group of electrodes, which are adjacent to said first group of electrodes, a shifting voltage which is lower than a usual firing voltage for elemental discharge areas and higher than a firing voltage which is decreased by the primary current effect due to the discharge spot of an adjacent elementary discharge area, and
d. erasing said discharge spot in said elemental discharge area corresponding to said first group of electrodes, thereby shifting the information displayed by said discharge spot in said elemental discharge areas associated with said first group of electrodes to the other elemental discharge areas associated with said second group of electrodes with the same pattern.

10. The method for shifting discharge spots according to method claim 9, wherein each pulse of said shifting voltage for the elemental discharge areas associated with the second group of electrodes is supplied prior to erasure of the discharge spot by removing the corresponding pulse of said sustaining voltage for the elemental discharge areas associated with the first group of electrodes.

11. Method for shifting discharge spots according to method claim 9, wherein the voltage level of said sustaining voltage is substantially equal to that of said shifting voltage.

* * * * *